(12) United States Patent
Malecke et al.

(10) Patent No.: US 10,455,712 B1
(45) Date of Patent: Oct. 22, 2019

(54) SEALED ELECTRONIC CONTROL MODULE HOUSING WITH INTEGRAL TERMINAL CARRIER DESIGN

(71) Applicant: VEONEER US INC., Southfield, MI (US)

(72) Inventors: Floyd J. Malecke, South Lyon, MI (US); Luis F. Sanchez, Commerce Twp., MI (US)

(73) Assignee: VEONEER US INC., Southfield, MI (US)

( * ) Notice: Subject to any disclaimer, the term of this patent is extended or adjusted under 35 U.S.C. 154(b) by 0 days.

(21) Appl. No.: 15/941,421

(22) Filed: Mar. 30, 2018

(51) Int. Cl.
*H01R 13/52* (2006.01)
*H05K 5/00* (2006.01)
*H01R 13/415* (2006.01)
*H01R 13/74* (2006.01)
*H01R 13/518* (2006.01)
*B60R 16/023* (2006.01)
*H05K 5/06* (2006.01)

(52) U.S. Cl.
CPC ......... *H05K 5/0069* (2013.01); *H01R 13/415* (2013.01); *H01R 13/518* (2013.01); *H01R 13/743* (2013.01); *H01R 13/748* (2013.01); *B60R 16/0231* (2013.01); *H05K 5/0047* (2013.01); *H05K 5/061* (2013.01)

(58) Field of Classification Search
CPC .... H05K 5/0069; H05K 5/0047; H05K 5/061; H01R 13/748; H01R 13/415; H01R 13/518; H01R 13/665; H01R 12/724
USPC ......................................................... 439/521
See application file for complete search history.

(56) References Cited

U.S. PATENT DOCUMENTS

| | | | |
|---|---|---|---|
| 6,095,826 A | 8/2000 | Potters | 439/79 |
| 6,773,272 B2 | 8/2004 | Koehler et al. | 439/79 |
| 7,080,990 B1* | 7/2006 | Juntwait | H01R 12/724 439/79 |
| 7,331,801 B1 | 2/2008 | Eichorn | 439/79 |
| 8,100,699 B1 | 1/2012 | Costello | 439/656 |
| 8,904,633 B2 | 12/2014 | Blossfeld et al. | |
| 9,293,870 B1* | 3/2016 | Koczwara | H05K 5/0069 |
| 9,295,171 B2 | 3/2016 | Blossfeld et al. | |
| 9,653,853 B2* | 5/2017 | Ohtani | H01R 13/665 |
| 2003/0199195 A1 | 10/2003 | Kochler et al. | 439/541.5 |
| 2016/0157364 A1 | 6/2016 | Blossfeld et al. | |

FOREIGN PATENT DOCUMENTS

| | | | |
|---|---|---|---|
| EP | 0179231 | 8/1985 | H01R 23/70 |
| EP | 1895823 | 3/2008 | H05K 7/14 |

* cited by examiner

*Primary Examiner* — Jean F Duverne
(74) *Attorney, Agent, or Firm* — Christopher P. Maiorana, PC

(57) ABSTRACT

An apparatus includes a terminal carrier and a housing shell. The terminal carrier generally comprises a plurality of terminals and a plurality of fastening tabs. The terminals have a first end with a shoulder on a first side of the terminal carrier and a second end on a second side of the terminal carrier with a bend formed a predetermined distance from the second side of the terminal carrier. The housing shell generally has an integral support. The integral support generally comprises a plurality of ports through which the second ends of the terminals extend, with the shoulders on the first end of the terminals providing support to the terminals for a press fit force applied to the first end of the terminals during assembly to a printed circuit board.

15 Claims, 16 Drawing Sheets

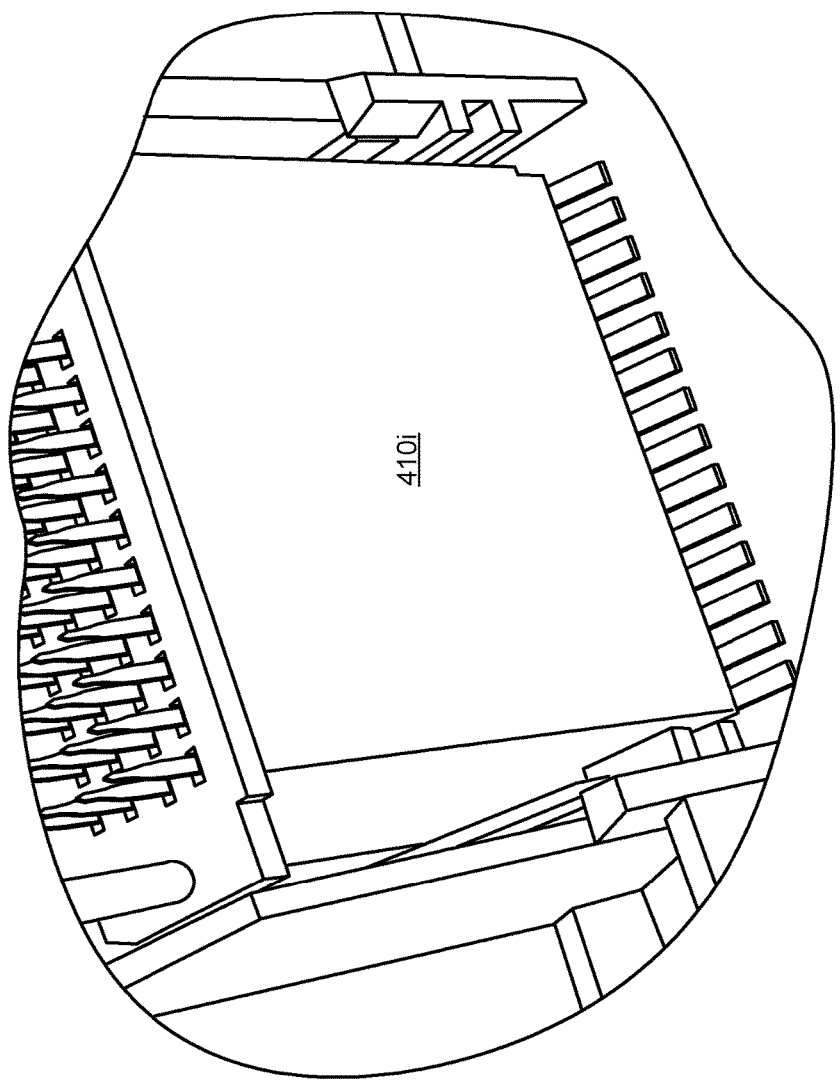

SEALED ELECTRONIC CONTROL MODULE HOUSING WITH INTEGRAL TERMINAL CARRIER DESIGN

FIELD OF THE INVENTION

The invention relates to automotive control assemblies generally and, more particularly, to a method and/or apparatus for implementing a sealed electronic control module housing with integral terminal carrier design.

BACKGROUND

A restraint control module enclosure generally contains some type of housing and a connector. The automotive industry requires a restraint control module be sealed to the environment in some applications. Thus, the restraint control module connector needs to eliminate potential leak paths. International Electrotechnical Commission (IEC) standard 60529, "Degrees of Protection Provided by Enclosures (IP Codes)," Ed. 2.2 (Geneva: International Electrotechnical Commission, 2013), classifies the degrees of protection provided against the intrusion of solid objects (including body parts like hands and fingers), dust, accidental contact, and water in electrical enclosures. The standard aims to provide users more detailed information than vague marketing terms such as waterproof. The automotive industry requirements vary from sealing a module from a light water spray (e.g., IP 53) to complete immersion to a depth of 1 meter for 30 minutes (e.g., IP 67/68). In some applications customers require sealing to pressures up to 6 psi (e.g., IP 68). In some cases the pressure differential is created due to a customer requirement to preheat the module to 85° C. prior to conducting the water spray or immersion testing.

It would be desirable to implement a sealed electronic control module housing with integral terminal carrier design.

SUMMARY

The invention concerns an apparatus including a terminal carrier and a housing shell. The terminal carrier generally comprises a plurality of terminals and a plurality of fastening tabs. The terminals have a first end with a shoulder on a first side of the terminal carrier and a second end on a second side of the terminal carrier with a bend formed a predetermined distance from the second side of the terminal carrier. The housing shell generally has an integral support. The integral support generally comprises a plurality of ports through which the second ends of the terminals extend, with the shoulders on the first end of the terminals providing support to the terminals for a press fit force applied to the first end of the terminals during assembly to a printed circuit board.

BRIEF DESCRIPTION OF THE FIGURES

Embodiments of the invention will be apparent from the following detailed description and the appended claims and drawings in which:

FIGS. 20-22 are diagrams illustrating another example housing in accordance with another example embodiment of the invention.

DETAILED DESCRIPTION OF THE EMBODIMENTS

Embodiments of the present invention include providing a sealed electronic control module housing with integral terminal carrier design that may (i) utilize stitched compliant terminals, (ii) provide a 90 degree bend in the terminals, (iii) support printed circuit board (PCB) pressfit force, (iv) support mating connector insertion force, (v) provide a terminal carrier that may be fastened using a snap fit, some type of weld, and/or screws, (vi) utilize terminal pins with in-and-out shoulders, (vii) utilize terminal pins with U-shaped shoulders, (viii) utilize terminal pins with tapered bodies, (ix) utilize a terminal alignment plate to insure true position of terminals, and/or (x) be implemented as one or more connectors in a housing of an electronic control unit.

A restraint control module enclosure typically contains some type of housing and a connector. If the connector can be designed integral to the housing, a potential leak path can be eliminated and potentially the cost of the enclosure is decreased. One difficulty in designing an integral connector housing is to be able to support a pressfit force associated with assembling a printed circuit board (PCB) to the integral connector of the housing. By designing a housing/terminal carrier with the features of the invention, the pressfit force may be supported by a bend in the terminals and/or shoulders of the terminals. In embodiments utilizing stitched terminals, the shoulders on the terminals at the pressfit end and the direction of stitching the terminal may further support the pressfit force. The terminal carrier housing design in accordance with an embodiment of the invention may decrease cost by removing labor and/or expensive insert molding from a supplier. The terminal carrier may be fastened to the housing by various methods including, but not limited to, snap fits, screws, or some type of welding. In various embodiments, terminal alignment plates may also be used to ensure true positioning of the terminals.

Compliant pins generally need some insertion (or pressfit) force in order to be assembled to plated holes on a printed circuit board (PCB). In various embodiments, an electronic control unit (ECU) design may be provided that utilizes compliant pins. In general, compliant pins need to be supported in order to slide inside plated holes of a PCB. In various embodiments, all or some of the terminal support may come from an interaction between the terminal carrier and the terminal. In various embodiments, the invention provides a terminal carrier, a housing with integral support, and novel pin designs.

Figure 1:
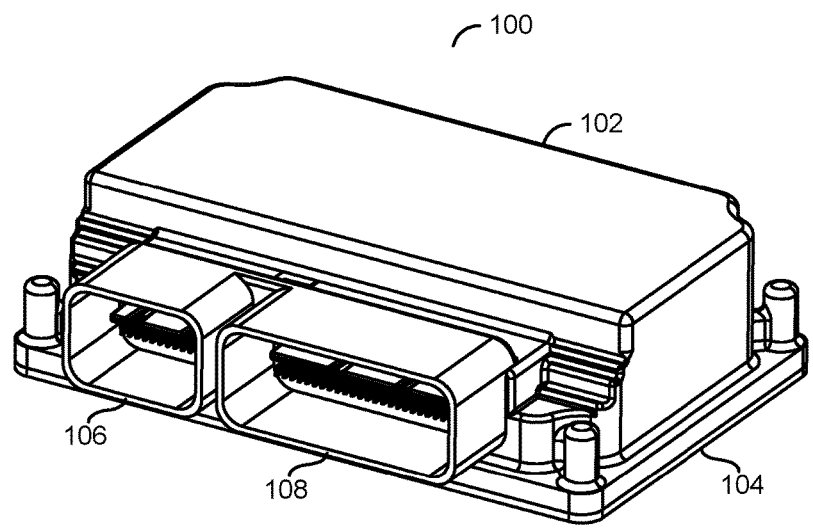
FIG. 1 is a diagram illustrating a housing in accordance with an example embodiment of the invention.

Referring to FIG. 1, a diagram is shown illustrating a housing 100 in accordance with an example embodiment of the invention. In various embodiments, the housing (or enclosure) 100 may be part of an electronic control unit (or module). In an example, the electronic control unit (ECU) may be configured for application in a motor vehicle. In an example, the housing 100 may be configured to enclose a restraint control module. In various embodiments, the housing (or enclosure) 100 comprises an upper housing 102 and a lower housing (or cover or baseplate) 104. In various embodiments, the upper housing 102 generally comprises a plastic or resin based material. In various embodiments, the plastic material may include, but is not limited to polyamide (NYLON), polybutylene terephthalate (PBT), polypropylene, polyethylene terephthalate (PET), acrylonitrile butadiene styrene (ABS), and/or various alloys and/or fillers of these resins. In various embodiments, the upper housing 102 generally includes one or more connectors integrated into the housing. Molding or otherwise incorporating the connectors as part of the enclosure (housing) eliminates the need for sealing the connector/housing interface. In various embodiment, the housing 100 generally includes an integral connector feature to reduce or eliminate potential leak paths.

In an example, the lower housing (or cover or baseplate) 104 may be implemented as a die cast aluminum baseplate. In another example, the lower housing (or cover or baseplate) 104 may be implemented as a stamped steel baseplate. Implementing the lower housing 104 with a metallic material may aid in dissipating heat generated by circuitry within the seated enclosure 100. In various embodiments, the lower housing 104 may be machined to create a sealing surface against which a gasket placed between the upper housing 102 and the lower housing 104 may form a seal when the upper housing 102 and the lower housing 104 are fastened together. The lower housing 104 is generally configured to provide a mounting footprint for the sealed electronic control module housing 100. In an example, the lower housing 104 may be implemented with an RCM8 mounting footprint to simplify testing. However, other footprints may be implemented to meet the design criteria of a particular application. In an example, the housing 100 may be implemented similarly to a housing described in co-pending U.S. Non-provisional application Ser. No. 15/925,665, which is incorporated by reference in its entirety.

In an example, the upper housing 102 may incorporate a 52 pin connector 106 and a 104 pin connector to provide electrical connections to a circuit board sealed within the enclosure 100. In an example, the connectors may be implemented as 1.8 mm pitch Nano connectors. However, other types and sizes of connectors may be implemented to meet the design criteria of a particular implementation. In an example, the enclosure 100 and the enclosed circuit board may implement a sealed restraint control module that can meet international standards for intrusion protection (e.g., an IP 67 Intrusion Protection Rating as specified in International Electrotechnical Commission (IEC) standard 60529).

Figure 2:
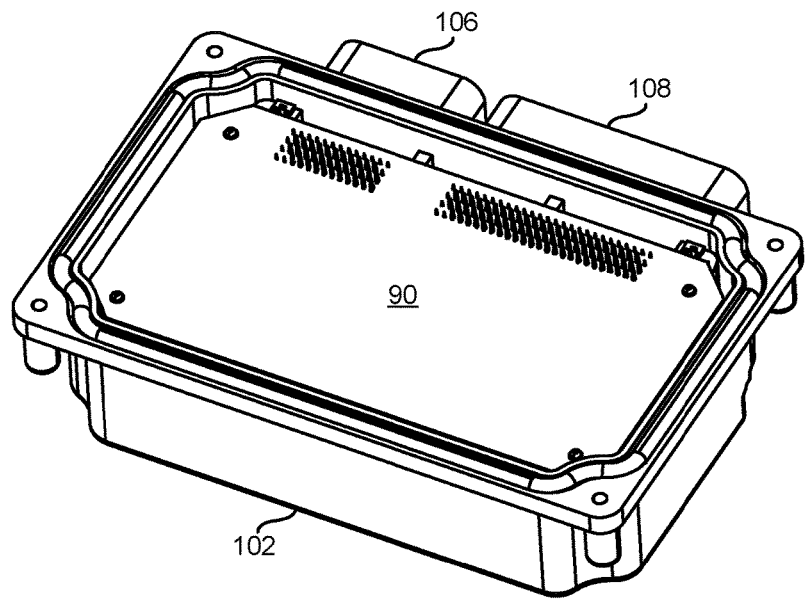
FIG. 2 is a diagram illustrating a circuit board mounted within the housing of FIG. 1.

Referring to FIG. 2, a diagram is shown illustrating a circuit board mounted within the housing 100 of FIG. 1. In various embodiments, a printed circuit board (PCB) 90 may be installed in the upper housing 102. The PCB 90 generally implements a design of an electronic control unit (ECU). In various embodiments, the ECU may implement a controller configured to control various operations and/or safety systems of a motor vehicle. In an example, the PCB 90 may implement a control circuit for a passenger restraint system (e.g., air bag, seatbelt retractor, etc.) of a motor vehicle. In various embodiments, the PCB 90 may be assembled to pins of an integral connector assembly. In various embodiments, the integral connector assembly is configured to support a pressfit force associated with assembling the PCB 90 to the integral connector of the housing 100.

Figure 3:
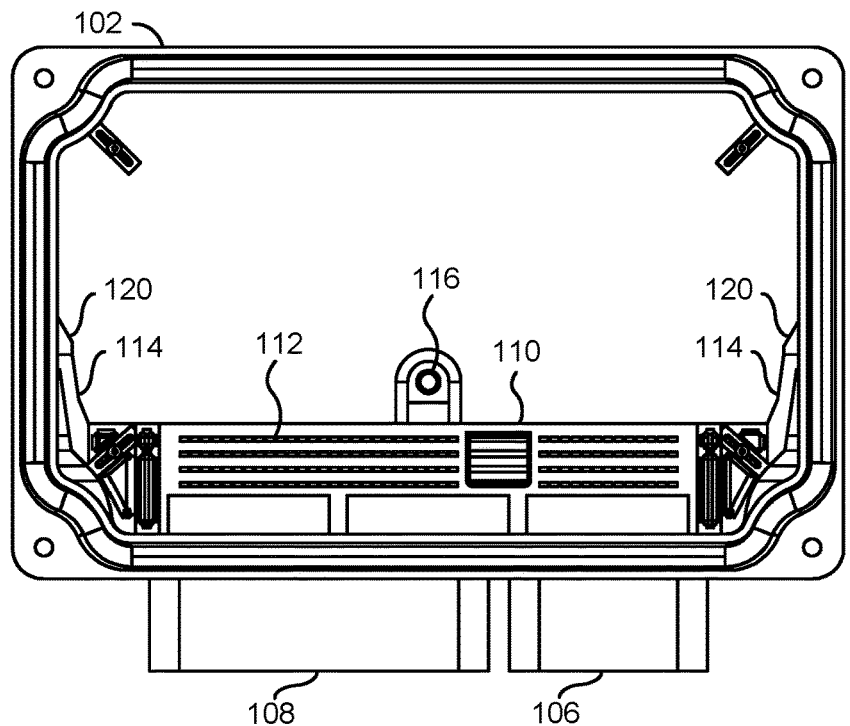
FIG. 3 is a diagram illustrating an interior view of the housing of FIG. 2 with the circuit board removed.

Referring to FIG. 3, a diagram is shown illustrating an interior view of the upper housing 102 of FIG. 2 with the circuit board 90 removed. In various embodiments, the upper housing 102 includes an integral connector assembly comprising a terminal carrier 110. In various embodiments, the terminal carrier 110 may further comprise a plurality of pins 112 and a number of spring tabs 114. In some embodiments, the terminal carrier 110 may also comprise a screw tab 116. In various embodiments, the terminal carrier 110 may be configured to slide into an integral support structure of the upper housing 102 until the pins 112 extend out of the upper housing 102 into the connectors 106 and 108. In various embodiments, the integral support structure in the upper housing 102 generally includes a plurality of ports into which the pins 112 may be slid. In an example, the ports may be slightly smaller than the pins 12 in order to form a tight fit to the pins 112 extending into the connectors 106 and 108. In various embodiments, when the terminal carrier 110 is slid into a final position, the spring tabs 114 may engage features 120 of the upper housing 102. The features 120 are generally configured to lock the terminal carrier 110 into position.

Figure 4:
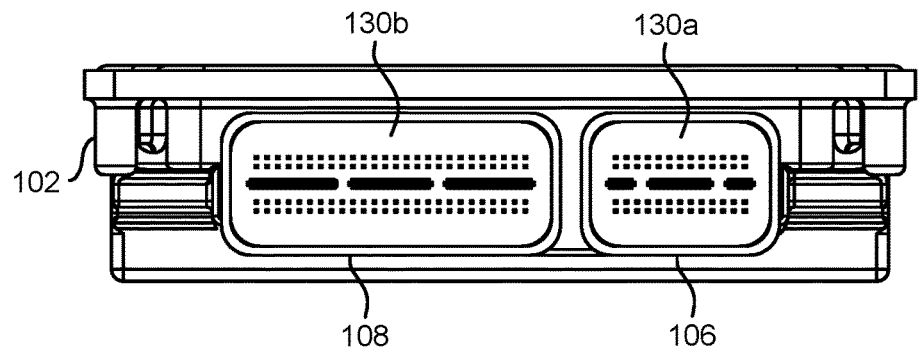
FIG. 4 is a diagram illustrating a view looking into connectors of the housing of FIG. 1.

Referring to FIG. 4, a diagram is shown illustrating a side view looking into connectors 106 and 108 of the upper housing 102 of FIG. 1. In various embodiments, the connectors 106 and 108 may include terminal alignment plates 130a and 130b, respectively. The terminal alignment plates may be configured to ensure alignment of the pins 112 extending through the ports of the integral support of the housing 102.

Figure 5:
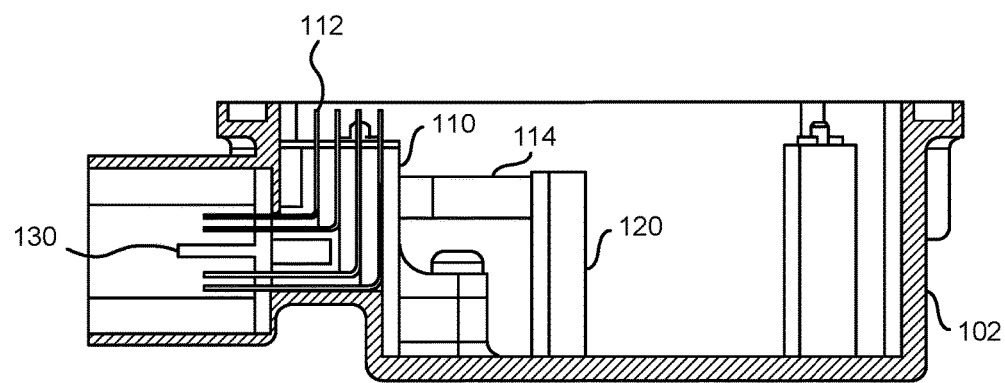
FIG. 5 is a diagram illustrating a cross-sectional view of the housing in accordance with an example embodiment of the invention.

Referring to FIG. 5, a diagram is shown illustrating a cross-sectional view of the upper housing 102 in accordance with an example embodiment of the invention. The pins 112 generally have a first end that extends from a first (top) side of the terminal carrier 110. A second end of the pins 112 on a second side of the terminal carrier 110 generally comprise a bend (e.g., 90 degrees) formed a predetermined distance from the second side of the terminal carrier 110. The second end of the pins 112 extend through ports in the upper housing 102 and holes in the terminal alignment plates 130.

Figure 6:
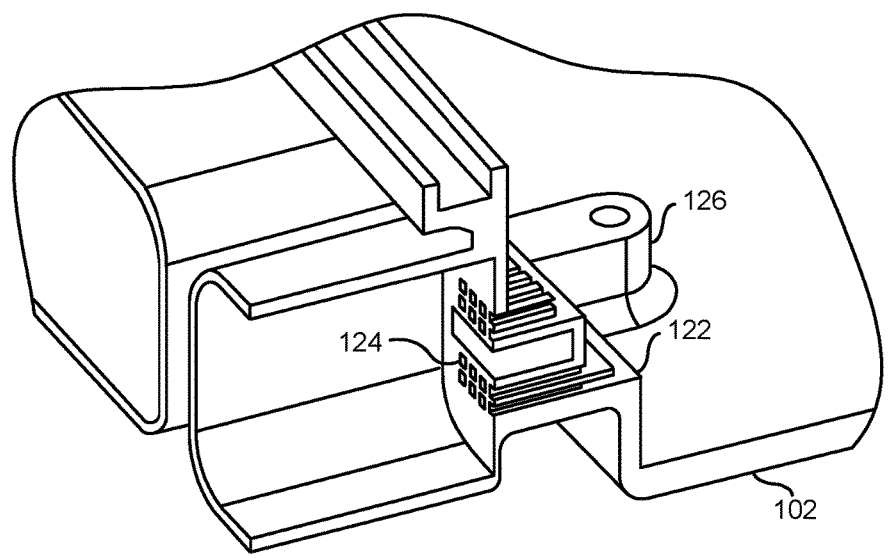
FIG. 6 is a diagram illustrating a cross-sectional view of an integral support within the housing in accordance with an example embodiment of the invention.

Referring to FIG. 6, a diagram is shown illustrating a cross-sectional view of an integral support within the upper housing 102 in accordance with an example embodiment of the invention. In various embodiments, the upper housing 102 includes an integral terminal support 122. The integral terminal support 122 includes a plurality of ports 124, through which the pins 112 may extend. The integral terminal support 122 may also include a feature 126 allowing the terminal carrier 110 to be further locked into position (e.g., by a threaded fastener).

Figure 7:
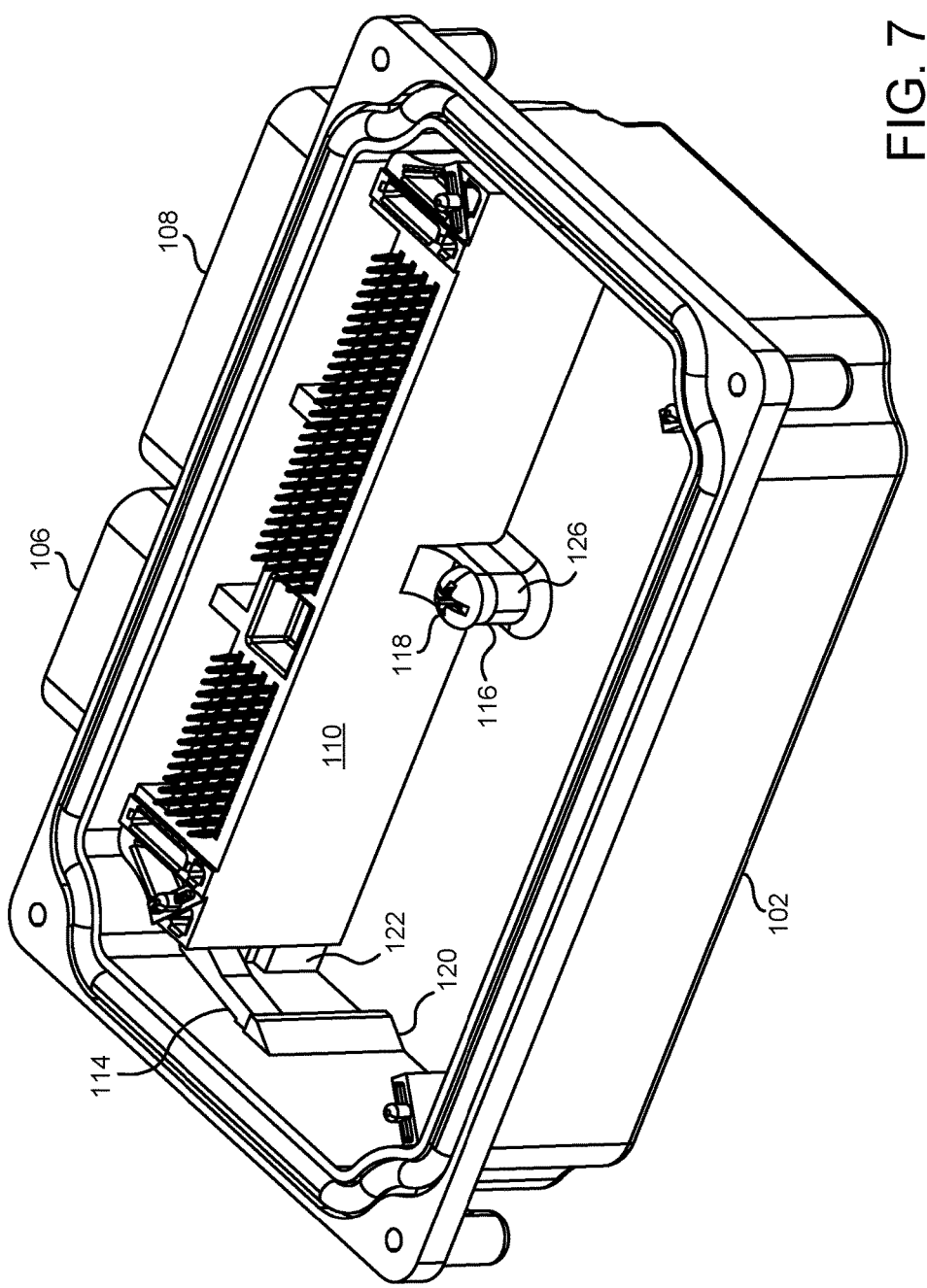
FIG. 7 is a diagram illustrating an example of a terminal carrier installed in a housing in accordance with an example embodiment of the invention.

Referring to FIG. 7, a diagram is shown illustrating an example of a terminal carrier 110 installed in the upper housing 102 in accordance with an example embodiment of the invention. In an example, when the terminal carrier 110 is installed in the upper housing 102, the spring tabs 114 engage the features 120 holding the terminal carrier 110 in place. A screw 118 may be installed through the screw tab 116 into the feature 126 to further lock the terminal carrier 110 into position.

Figure 8:
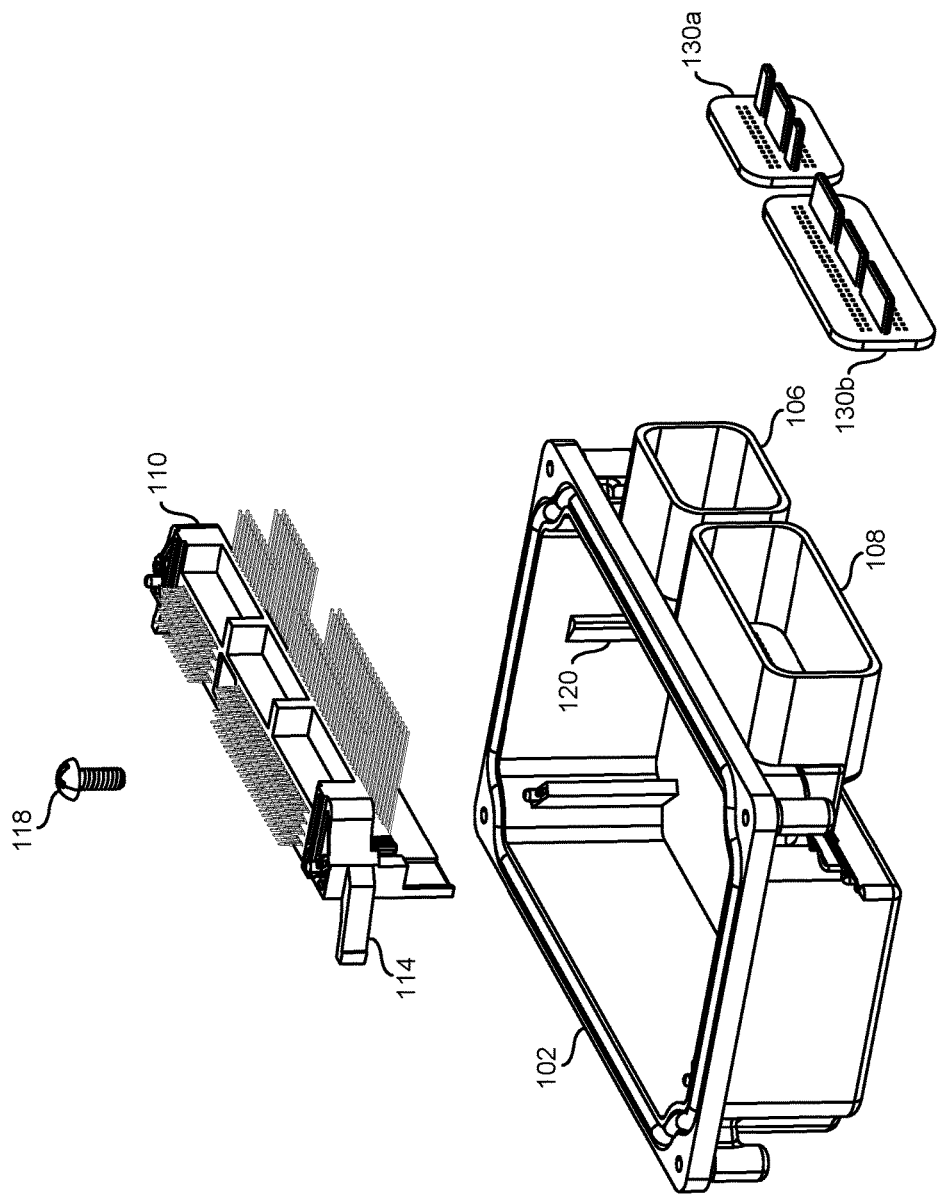
FIG. 8 is a diagram illustrating an exploded view of the housing of FIG. 7.

Referring to FIG. 8, a diagram is shown illustrating an exploded view of the upper housing 100 of FIG. 7. In an example, assembly of the housing 100 may comprise inserting the terminal carrier 110 into the upper housing 102, snapping the terminal carrier 110 into position, and locking the assembly together using the threaded fastener 118. Prior to the insertion of the terminal carrier 110, the terminal alignment plates 130a and 130b are inserted into the openings of the connectors 106 and 108.

Figure 9:
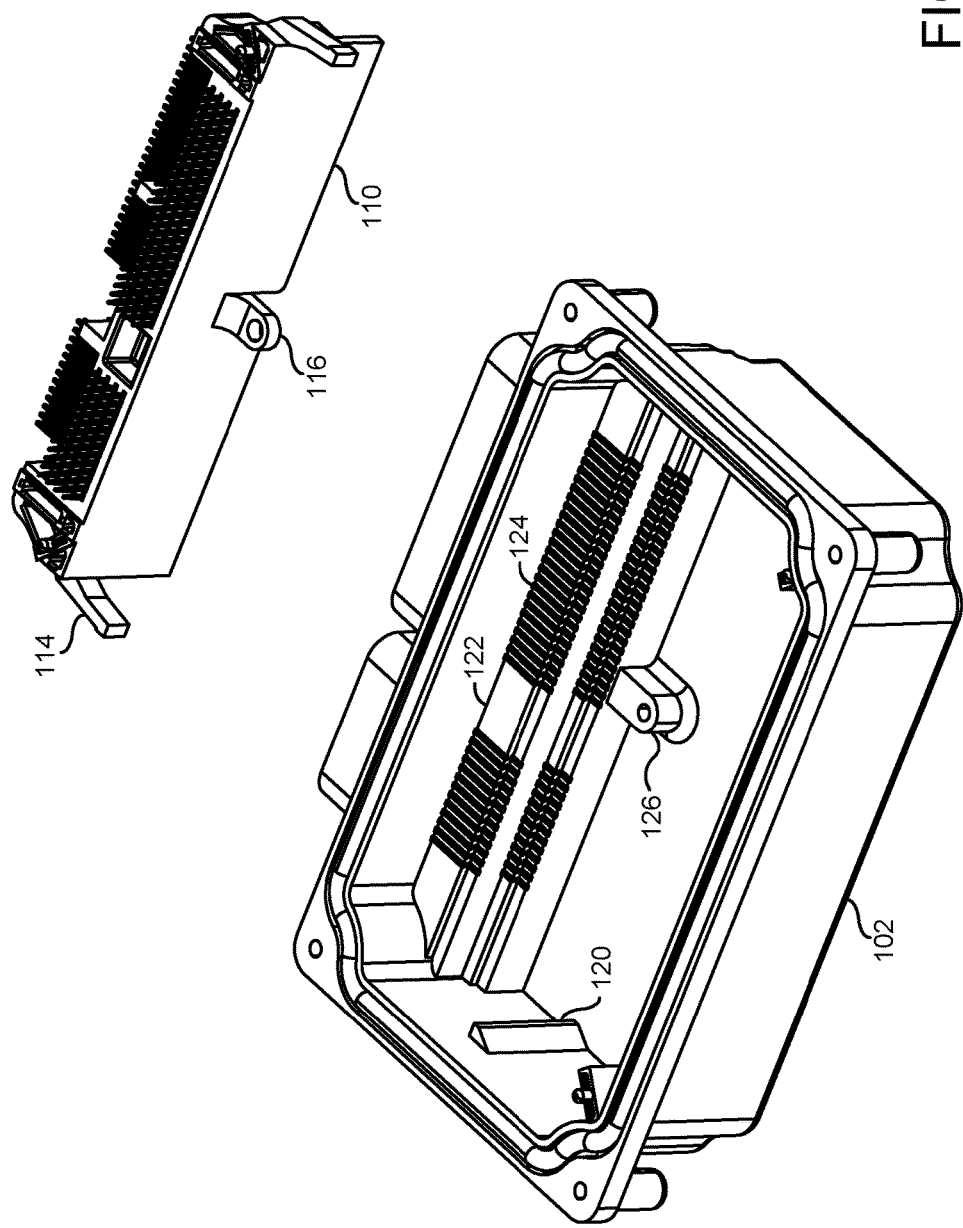
FIG. 9 is a diagram illustrating an integral support structure of the housing of FIG. 8.

Referring to FIG. 9, a diagram is shown illustrating an interior view of the upper housing 102 looking toward the integral support structure 122. In various embodiments, the upper housing 102 and the integral support structure 122 are generally molded together in a single molding step. The integral support structure 122 is generally configured to provide one or more tiers of ports 126 matching an arrangement of pins 112 in the terminal carrier 110. The terminal carrier 110 and the integral support structure 122 generally have complementary shapes, allowing the two structures to fit together tightly.

Figure 10:
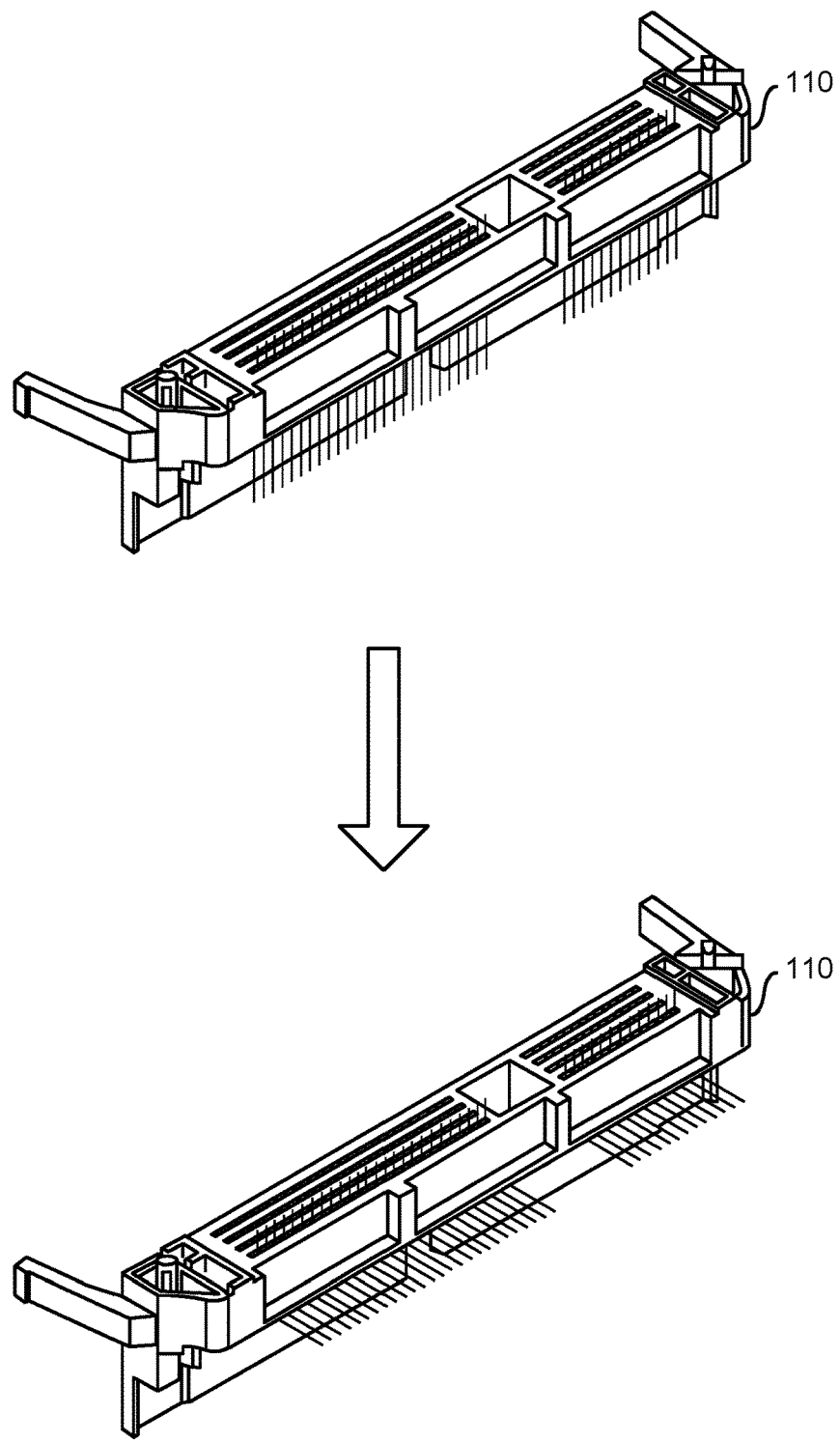
FIG. 10 is a diagram illustrating a first step in manufacturing a terminal carrier subassembly in accordance with an example embodiment of the invention.

Referring to FIG. 10, a diagram is shown illustrating an example first step in manufacturing a terminal carrier subassembly in accordance with an example embodiment of the invention. In a first step of a manufacturing process flow, a first row of the terminals (or pins) 112 are inserted (stitched) into the terminal carrier 110 and bent 90 degrees. In an example, the terminals 112 of the first row are generally inserted into a first side of the terminal carrier 110 and the bend is formed a first predetermined distance from a second side of the terminal carrier 110.

Figure 11:
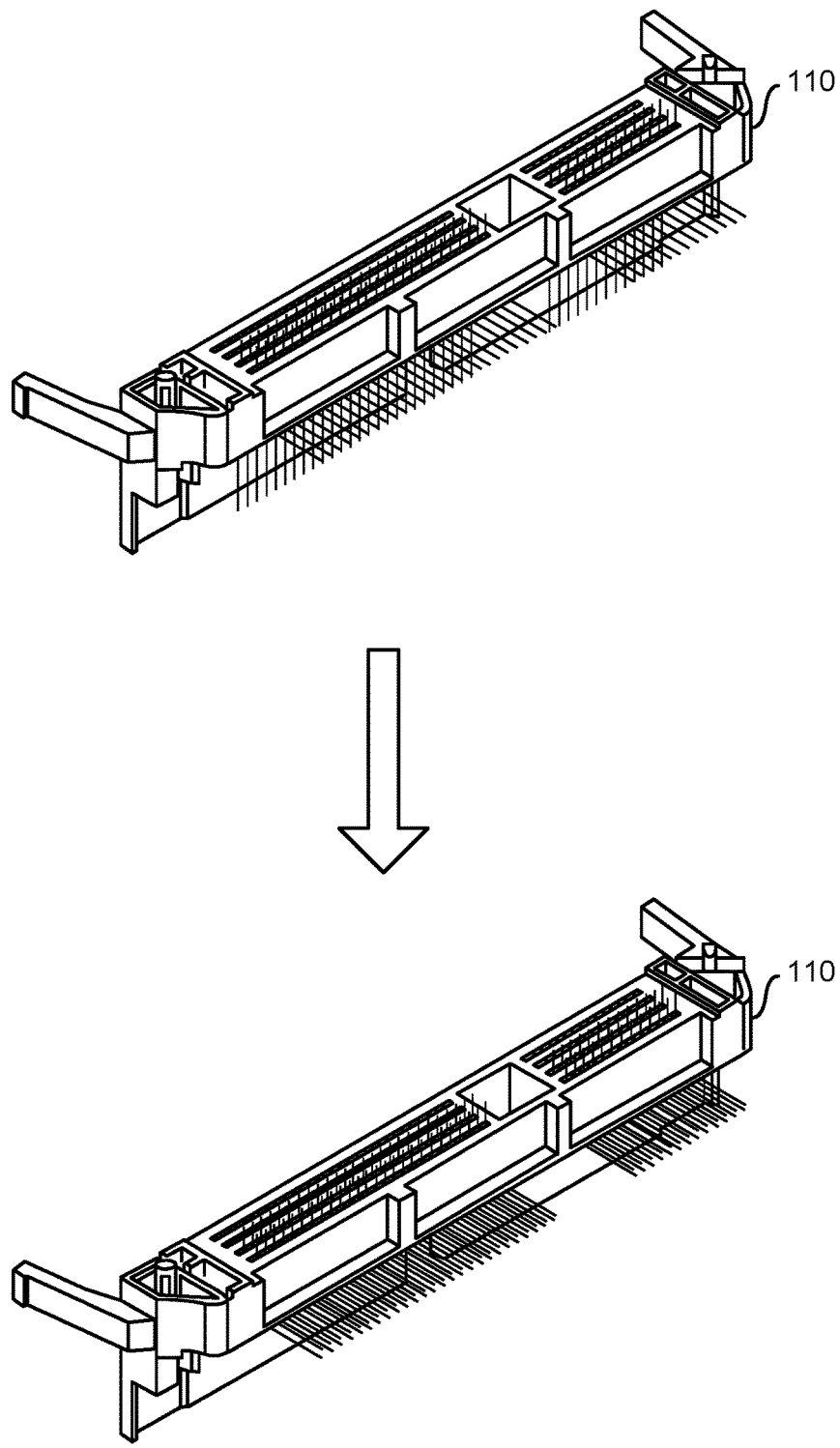
FIG. 11 is a diagram illustrating a second step in manufacturing a terminal carrier subassembly in accordance with an example embodiment of the invention.

Referring to FIG. 11, a diagram is shown illustrating a second step in manufacturing a terminal carrier subassembly in accordance with an example embodiment of the invention. In a second step of a manufacturing process flow, a second row of the terminals (or pins) 112 are inserted (stitched) into the terminal carrier 110 and bent 90 degrees. In an example, the terminals 112 of the second row are generally inserted into the first side of the terminal carrier 110 and the bend is formed a second predetermined distance from the second side of the terminal carrier 110.

Figure 12:
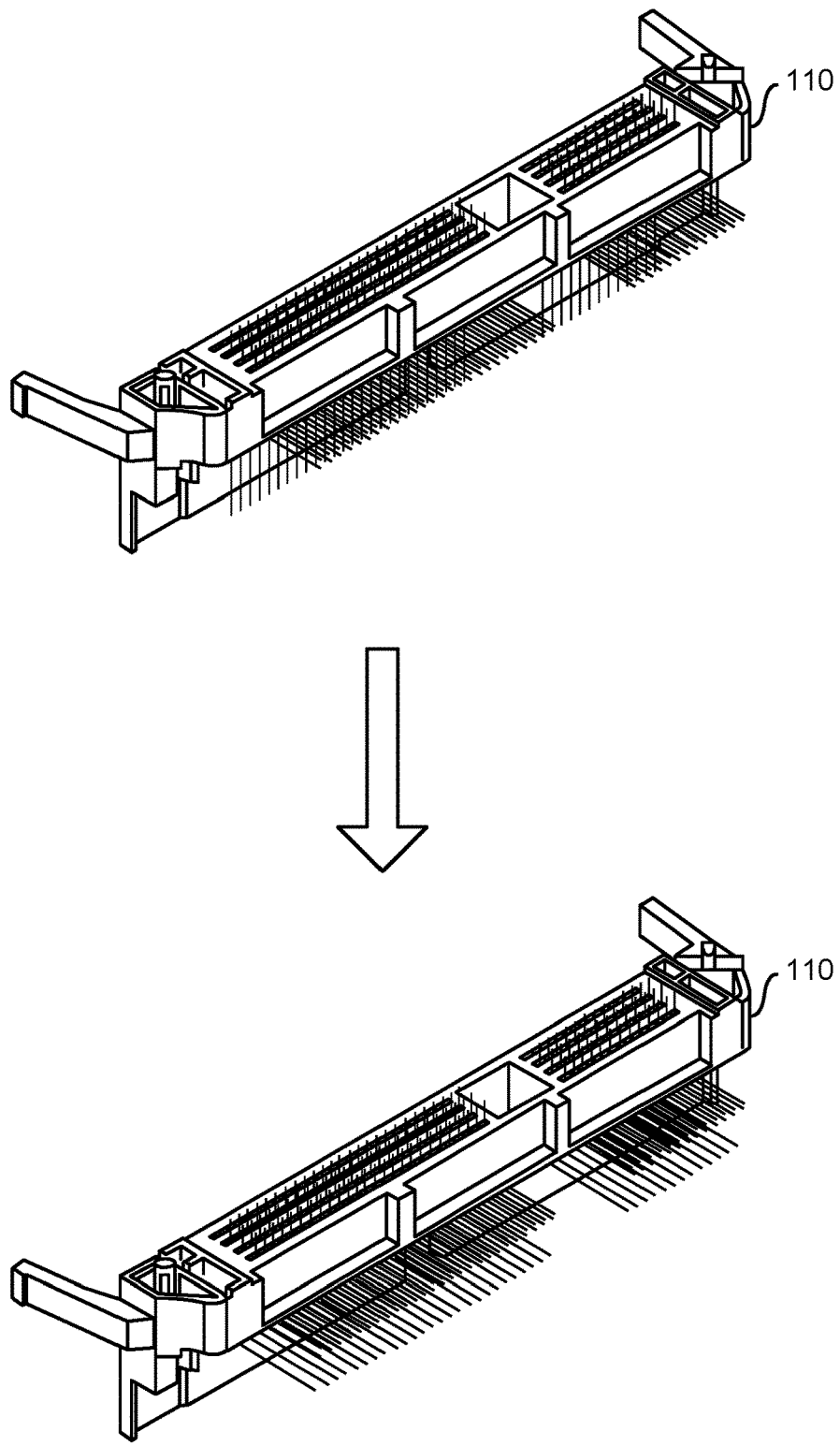
FIG. 12 is a diagram illustrating a third step in manufacturing a terminal carrier subassembly in accordance with an example embodiment of the invention.

Referring to FIG. 12, a diagram is shown illustrating a third step in manufacturing a terminal carrier subassembly in accordance with an example embodiment of the invention. In a third step of a manufacturing process flow, a third row of the terminals (or pins) 112 are inserted (stitched) into the terminal carrier 110 and bent 90 degrees. In an example, the terminals 112 of the third row are generally inserted into the first side of the terminal carrier 110 and the bend is formed a third predetermined distance from the second side of the terminal carrier 110.

Figure 13:
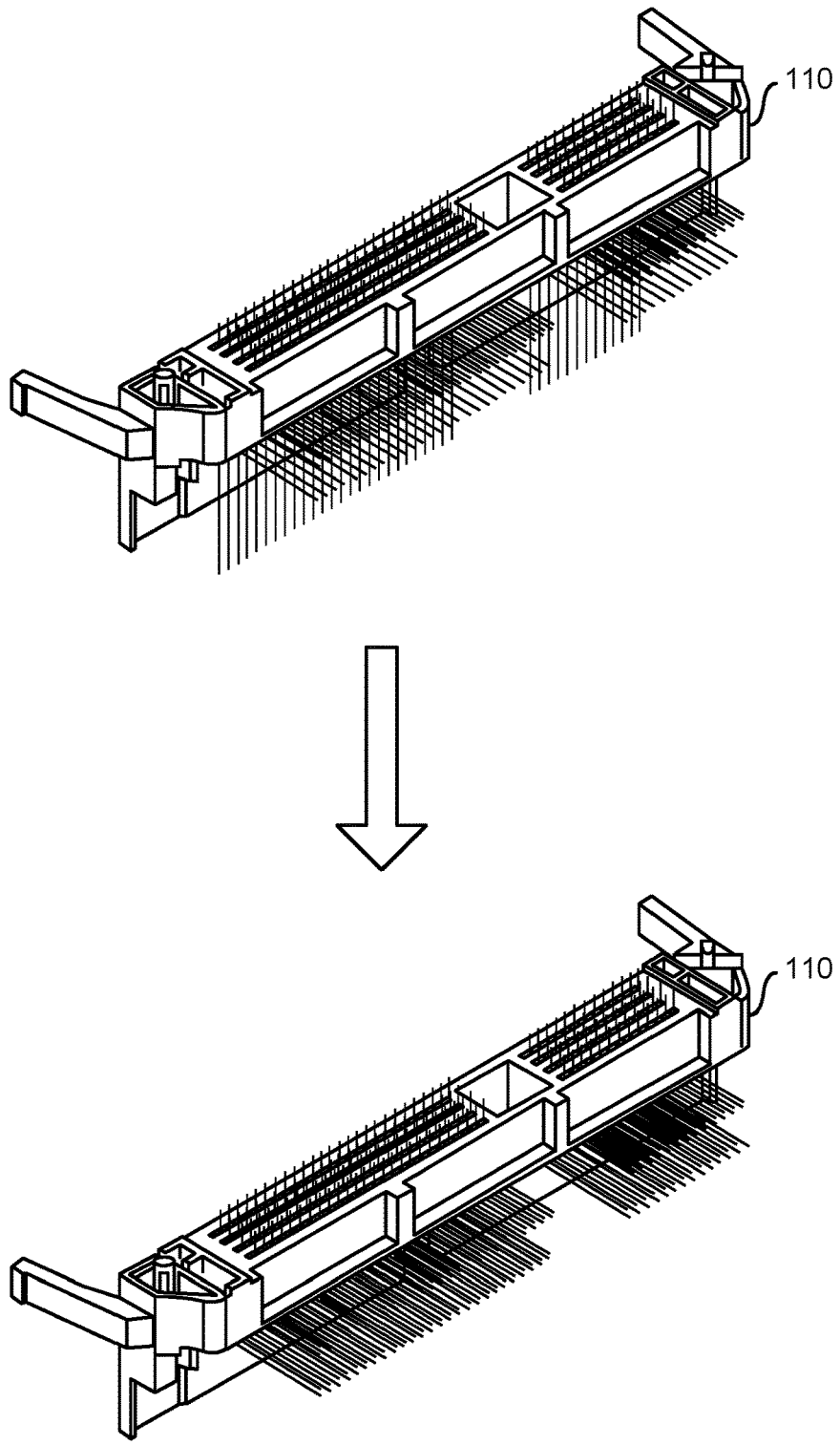
FIG. 13 is a diagram illustrating a fourth step in manufacturing a terminal carrier subassembly in accordance with an example embodiment of the invention.

Referring to FIG. 13, a diagram is shown illustrating a fourth step in manufacturing a terminal carrier subassembly in accordance with an example embodiment of the invention. In a fourth step of a manufacturing process flow, a fourth row of the terminals (or pins) 112 are inserted (stitched) into the terminal carrier 110 and bent 90 degrees. In an example, the terminals 112 of the fourth row are generally inserted into the first side of the terminal carrier 110 and the bend is formed a fourth predetermined distance from the second side of the terminal carrier 110. The process illustrated in FIGS. 10-13 may be repeated for additional rows of terminals if desired.

Figure 14:
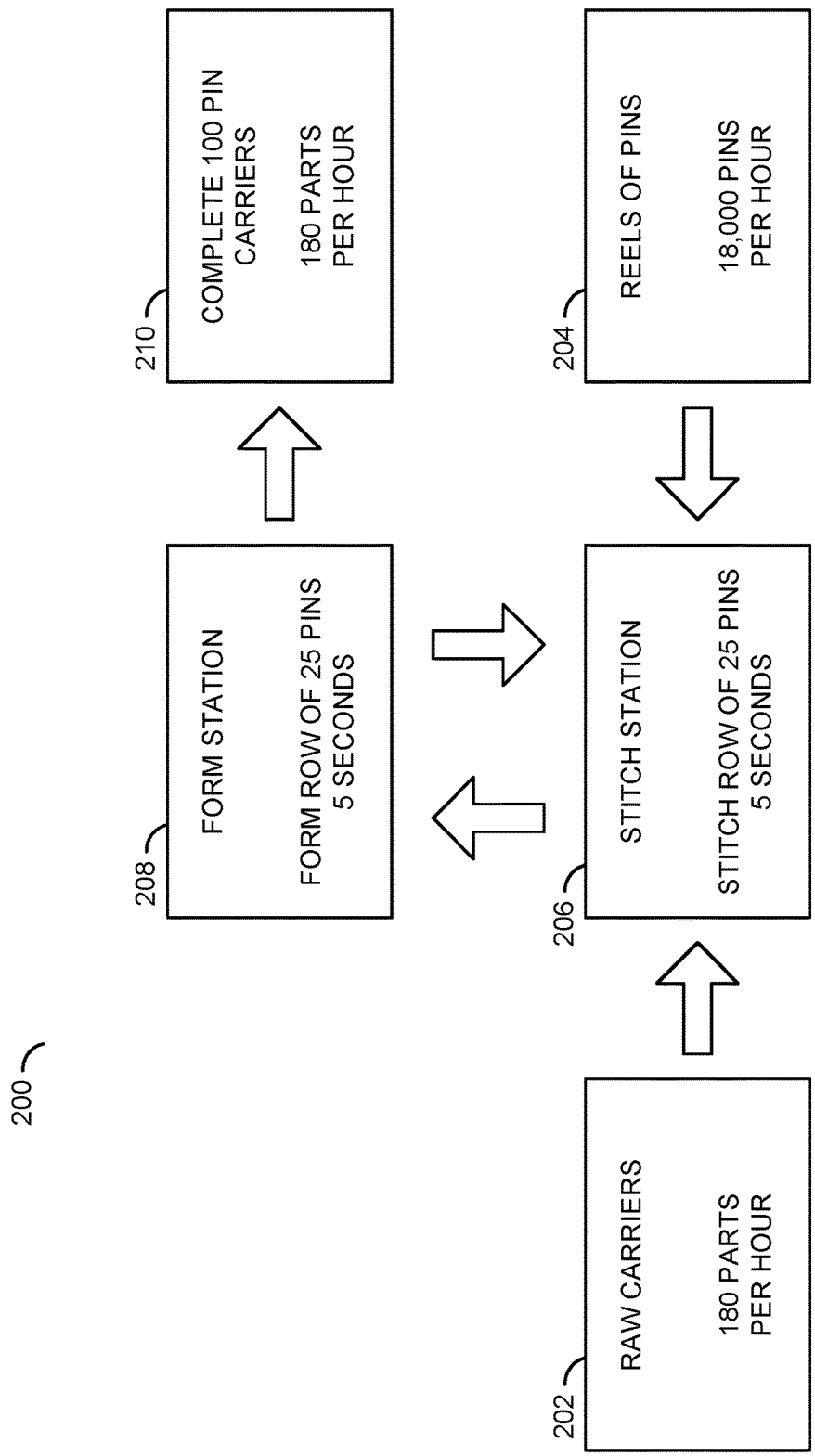
FIG. 14 is a diagram illustrating a manufacturing process flow in accordance with an example embodiment of the invention.

Referring to FIG. 14, a diagram is shown illustrating a manufacturing process flow in accordance with an example embodiment of the invention. In an example, a process (or method) 200 may be implemented to manufacture a terminal carrier in accordance with an example embodiment of the invention. In an example, the process 200 may comprise a step (or stage) 202, a step (or stage) 204, a step (or stage) 206, a step (or stage) 208, and a step (or stage) 210. In the step 202, raw carriers may be prepared as an input feed to a stitching station. In an example, the raw carriers may be fed at a rate of 180 parts per hour. In the step 204, reels of pins (or terminals) may be prepared as a second input feed to the stitching machine. In an example, the pins may be fed at a rate of 18,000 pins per hour. In the step 206, the stitching station may stitch a row of 25 pins into a raw carrier from the input feed 202. In an example, the stitching station may stitch the row of pins in 5 seconds. The stitching station then passes the stitched carrier to a form station. In the step 208, the form station forms an appropriate bend for the current row. In an example, the form station may form the row of pins in 5 seconds. The steps 204 and 206 may be repeated until the number or rows of terminals desired have been stitched and formed. When the desired number of rows are stitched and formed, the process 200 moves to the step 210, where the completed carrier may be binned for subsequent assembly steps. In an example, the process 200 may be able to produce 180 parts (e.g., 100 pin carriers) per hour. The process 200 may be scaled to produce other size pin carriers.

Figure 15:
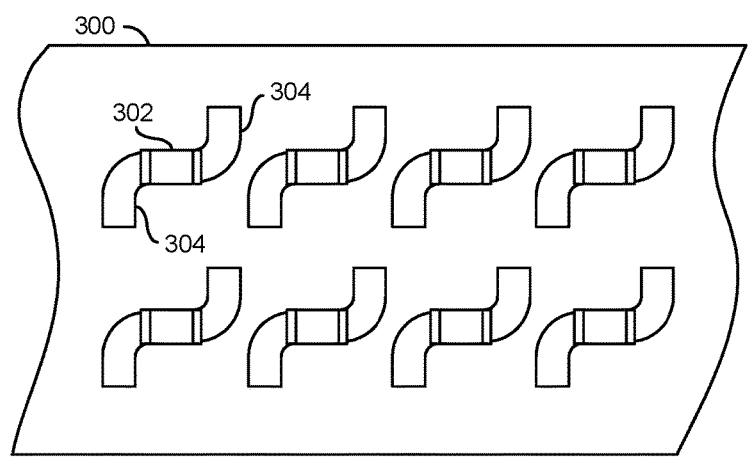
FIGS. 15 and 16 are diagrams illustrating an example in-and-out terminal pin shoulder in accordance with an example embodiment of the invention.
Figure 16:
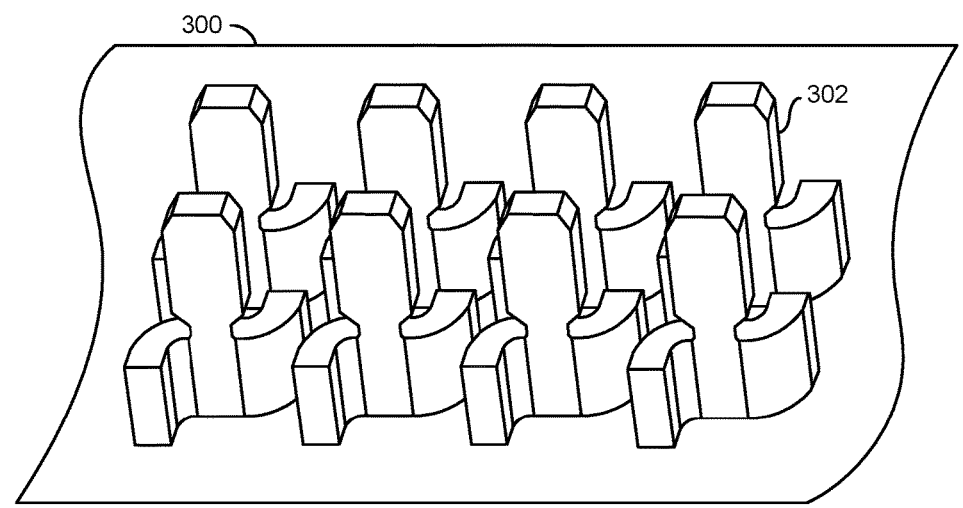

Referring to FIGS. 15 and 16, diagrams are shown illustrating an example in-and-out terminal pin shoulder in accordance with an example embodiment of the invention. In various embodiments, the full load of the compliant pin insertion is generally handled by the shoulders 304 on terminal pins 302. The shoulders 304 need to have enough surface so the shoulders do not "dig in" or "cut in" the plastic header of the terminal carrier 300 when a force is applied to the terminal 302. One way to prevent the shoulders 304 from digging in is to maximize the surface area between the shoulders 304 of the pins 302 and the surface of the terminal carrier 300. In an example, the surface area between the terminal carrier 300 and the shoulders 304 may be maximized by increasing a length of the shoulders 304 on each side of the pin 302 and bending the respective shoulders 304 of each pin 302 in opposite directions (e.g., forming an ogee or "S" shape). Since the pitch between terminals is small, enlarging the shoulders 304 may result in the shoulders 304 of adjacent pins 302 touching or being close to touching if the shoulders 304 remain just straight. By bending the shoulders 304 of the terminals 302, there will be enough support surface and also the terminal shoulder 304 will not touch or be very close to adjacent shoulders 304.

Figure 17:
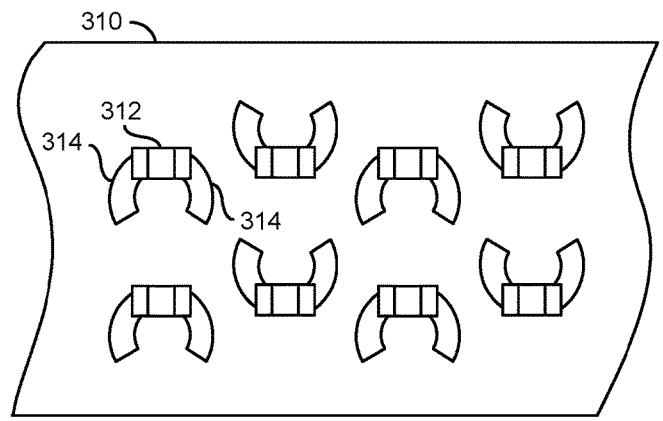
FIGS. 17 and 18 are diagrams illustrating an example U-shaped terminal pin shoulder in accordance with an example embodiment of the invention.
Figure 18:
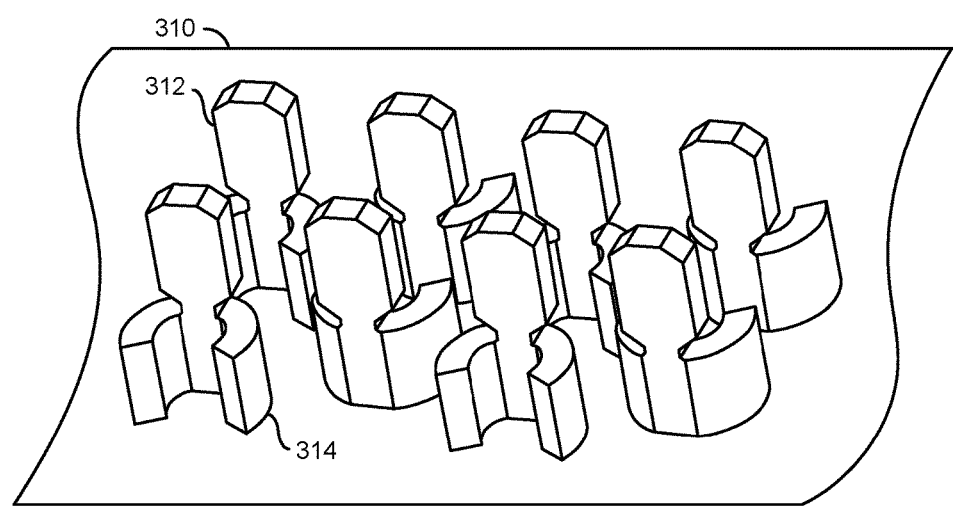

Referring to FIGS. 17 and 18, diagrams are shown illustrating an example U-shaped terminal pin shoulder in accordance with another example embodiment of the invention. Similar to the example illustrated in FIGS. 15 and 16, the entire insertion force of a compliant pin 312 is supported by shoulders 314 of the terminals 312 engaging a surface of a terminal carrier 310. In contrast to the example illustrated in FIGS. 15 and 16, shoulders 314 of the terminals 312 may be bent in a "U" shape. The "U" shape bend of the shoulders 314 also helps to reduce the chance of shorting or touching adjacent terminal shoulders.

Figure 19:
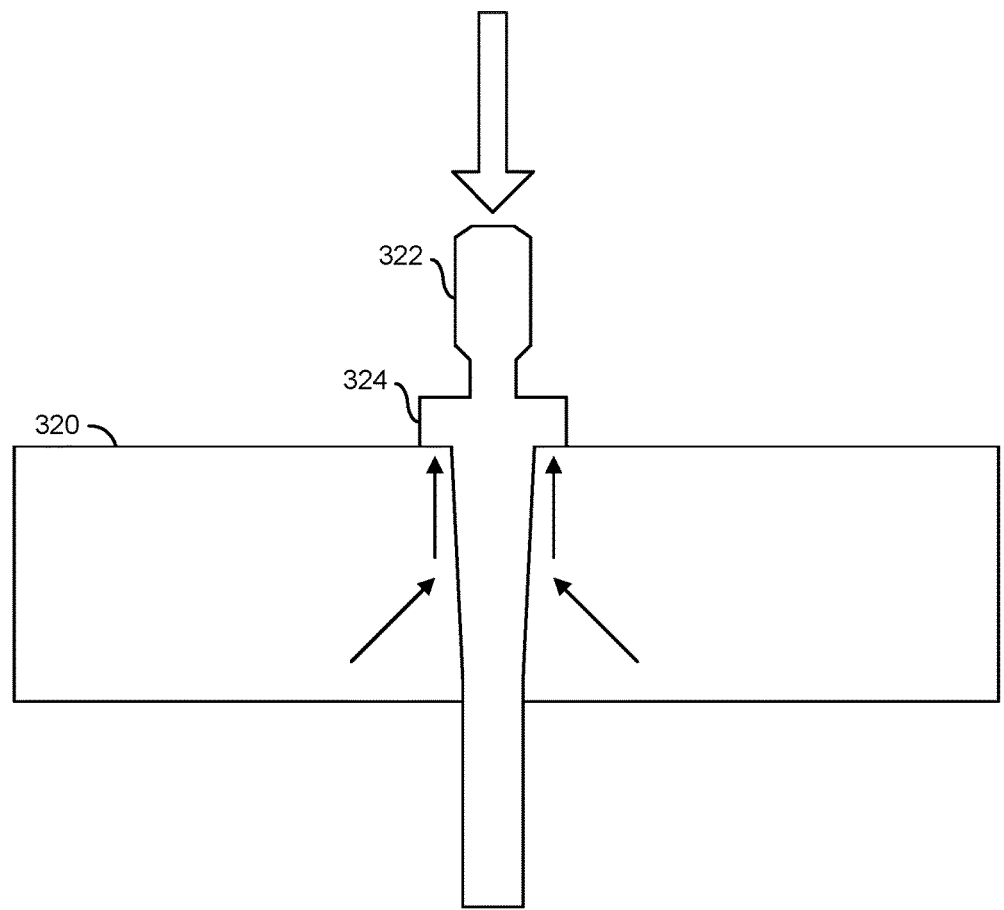
FIG. 19 is a diagram illustrating an example tapered terminal pin body in accordance with an example embodiment of the invention.

Referring to FIG. 19, a diagram is shown illustrating an example tapered terminal pin body in accordance with still another example embodiment of the invention. In an example, a terminal carrier 320 may have pins 322 inserted. A shoulder 324 of the terminal 322 will seat flat to the top surface of the plastic carrier or header 320, like in many other applications. The difference is that a side of the terminal 322 may have angles, allowing the pin 322 to be assembled into a tapered cavity in the terminal carrier 320. When a force is applied (arrow), the support force is distributed between the shoulder 324 and the tapered sides of the terminal 322.

Figure 20:
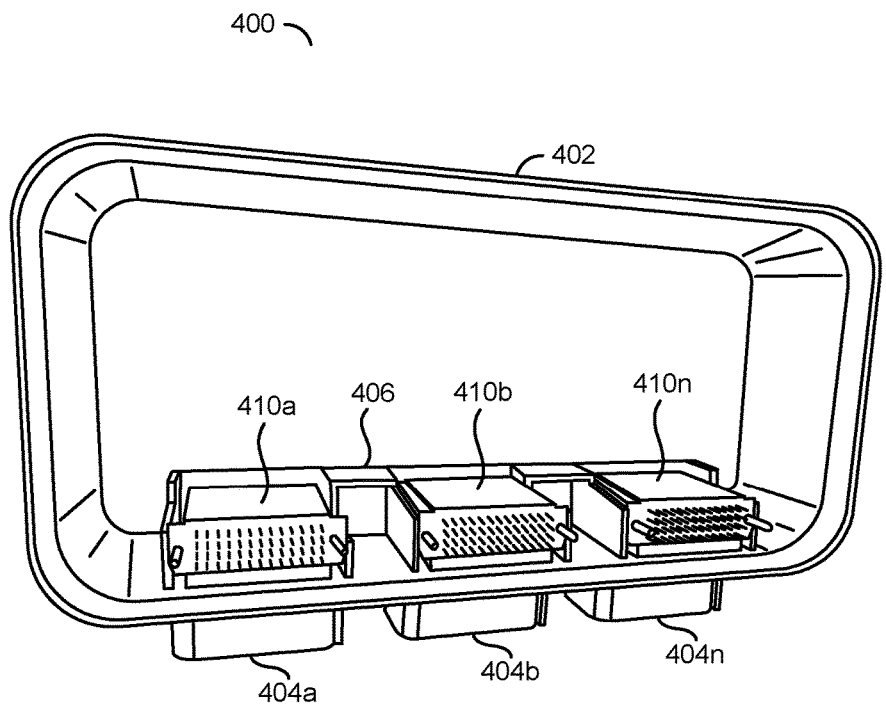
Figure 21:
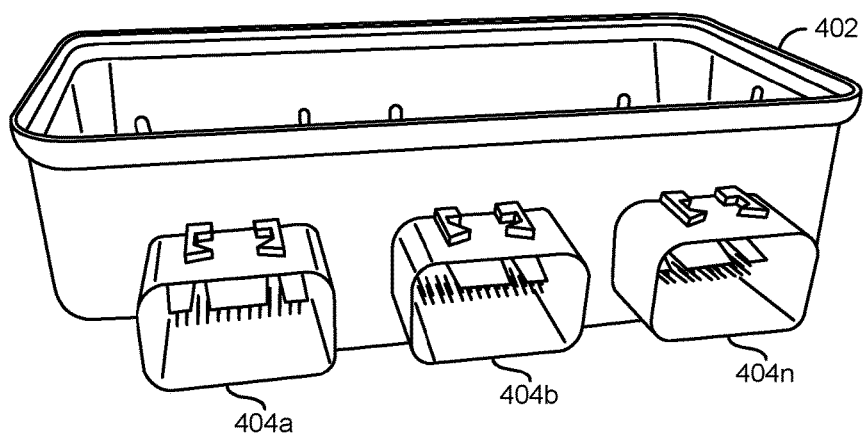

Referring to FIGS. 20-22, diagrams are shown illustrating another example housing in accordance with another example embodiment of the invention. In another example, a housing 400 may comprise an upper housing shell 402 having a plurality of connectors 404a-404n. Referring to FIG. 20, a diagram is shown illustrating an interior view of the housing 400. In various embodiments, the upper housing shell 402 may include an integral support structure 406. The integral support structure 406 may have a plurality of slots, where each slot is configured to receive a respective snap fit terminal carrier 410a-410n. The terminal carriers 410a-410n may include spring tabs similar to the spring tabs 114 described above. Each of the terminal carriers 410a-410n may be configured to slide into a corresponding one of the slots in the integral support structure 406 of the upper housing shell 402. The terminal carriers 410a-410n may be snapfit (locked) into the slots in the integral support structure 406 by the spring tabs. The terminal carriers 410a-410n may comprise a plurality of rows of pins, where each row includes a plurality of pins.

Referring to FIG. 21, a diagram is shown illustrating the upper housing shell 402 viewed from the side with the connector 404a-404n. In an example, each of the connectors 404a-404n may include a pin alignment plate similar to the alignment plates 130a-130b described above.

Referring to FIG. 22, a diagram is shown illustrating spring tabs of an exemplary terminal carrier 410i engaging features of the integral support structure 406 of the upper housing shell 402.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a terminal carrier comprising a plurality of terminals and a plurality of fastening tabs, wherein the terminals have a first end with a shoulder on a first side of the terminal carrier and a second end on a second side of the terminal carrier with a bend formed a predetermined distance from the second side of the terminal carrier; and
a housing shell having an integral support, wherein the housing shell and the integral support are formed as a single integrated structure, the integral support comprises one or more tiers, each having a plurality of ports through which the second ends of the terminals extend when the terminal carrier is assembled to the housing shell, with the shoulders on the first end of the terminals providing support to the terminals for a press fit force applied to the first end of the terminals during assembly to a printed circuit board.

2. The apparatus according to claim 1, further comprising a terminal alignment plate configured to align the second ends of the terminals extending through the ports of the integral support of the housing.

3. The apparatus according to claim 1, wherein the integral support of the housing is configured to provide support to the terminals for the press fit force applied to the first end of the terminals during assembly to the printed circuit board by supporting the bend in the second end of the terminals.

4. The apparatus according to claim 1, wherein the plurality of fastening tabs of the terminal carrier are configured to provide a snap fit with the integral support of the housing.

5. The apparatus according to claim 1, wherein at least one of the plurality of fastening tabs of the terminal carrier is configured to fastened the terminal carrier to the integral support of the housing with a threaded fastener.

6. The apparatus according to claim 1, wherein the shoulder of each terminal comprises two tabs extending in opposite directions from the terminal.

7. The apparatus according to claim 1, wherein the shoulder of each terminal comprises two curved tabs extending in opposite directions from the terminal.

8. The apparatus according to claim 1, wherein the shoulder of each terminal comprises two curved tabs extending from the terminal in a U-shape.

9. The apparatus according to claim 1, wherein each terminal comprises a tapered portion within the terminal carrier that narrows toward the second end of each terminal.

10. The apparatus according to claim 1, wherein the plurality of terminals are stitched into the terminal carrier.

11. A sealed restraint control module comprising:
a terminal carrier comprising a plurality of terminals and a plurality of fastening tabs, wherein the terminals have a first end with a shoulder on a first side of the terminal carrier and a second end on a second side of the terminal carrier with a bend formed a predetermined distance from the second side of the terminal carrier; and
a housing shell having an integral support, wherein the housing shell and the integral support are formed as a single integrated structure, the integral support comprises one or more tiers, each having a plurality of ports through which the second ends of the terminals extend when the terminal carrier is assembled to the housing shell, with the shoulders on the first end of the terminals providing support to the terminals for a press fit force applied to the first end of the terminals during assembly to a printed circuit board.

12. The sealed restraint control module according to claim 11, further comprising a terminal alignment plate configured to align the second ends of the terminals extending through the ports of the integral support of the housing.

13. The sealed restraint control module according to claim 11, wherein the integral support of the housing is configured to provide support to the terminals for the press fit force applied to the first end of the terminals during assembly to the printed circuit board by supporting the bend in the second end of the terminals.

14. The sealed restraint control module according to claim 11, wherein the plurality of fastening tabs of the terminal carrier are configured to provide a snap fit with the integral support of the housing.

15. The sealed restraint control module according to claim 11, wherein at least one of the plurality of fastening tabs of the terminal carrier is configured to fastened the terminal carrier to the integral support of the housing with a threaded fastener.

* * * * *